(12) United States Patent
Nomura et al.

(10) Patent No.: US 9,456,503 B2
(45) Date of Patent: Sep. 27, 2016

(54) MODULE AND METHOD OF MANUFACTURING THE SAME

(71) Applicant: Murata Manufacturing Co., Ltd., Kyoto-fu (JP)

(72) Inventors: Tadashi Nomura, Kyoto-fu (JP); Akihiko Kamada, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 141 days.

(21) Appl. No.: 14/209,106

(22) Filed: Mar. 13, 2014

(65) Prior Publication Data

US 2014/0268587 A1   Sep. 18, 2014

(30) Foreign Application Priority Data

Mar. 15, 2013  (JP) .................................. 2013-052628

(51) Int. Cl.
*H05K 1/18* (2006.01)
*H05K 3/28* (2006.01)
(Continued)

(52) U.S. Cl.
CPC ..... *H05K 3/284* (2013.01); *H01L 2224/16225* (2013.01); *H01L 2224/48091* (2013.01); *H01L 2224/48227* (2013.01); *H01L 2924/15311* (2013.01); *H01L 2924/19105* (2013.01); *H05K 1/0306* (2013.01); *H05K 1/144* (2013.01); *H05K 2201/096* (2013.01); *H05K 2201/09063* (2013.01); *H05K 2201/09154* (2013.01); *H05K 2201/09163* (2013.01); *H05K 2201/09845* (2013.01); *H05K 2201/10378* (2013.01); *H05K 2201/2018* (2013.01); *H05K 2201/2072* (2013.01); *H05K 2203/063* (2013.01); *H05K 2203/1327* (2013.01); *Y10T 29/49146* (2015.01)

(58) Field of Classification Search
CPC ......... H05K 2201/10568; H05K 2201/10575; H05K 2201/2036; H05K 1/144; H05K 2201/041–2201/042
USPC .......................... 361/760–790; 257/685–688
See application file for complete search history.

(56) References Cited

U.S. PATENT DOCUMENTS 5,570,274 A * 10/1996 Saito ..................... H01L 23/053
174/260
6,493,240 B2 * 12/2002 Broglia .................. H05K 1/141
361/736

(Continued)

FOREIGN PATENT DOCUMENTS

JP     07-266767 A     10/1995
JP     2008-098273 A    4/2008

(Continued)

OTHER PUBLICATIONS

Decision of Rejection issued in Application No. JP2013-052628 on Jun. 2, 2015.

(Continued)

*Primary Examiner* — Tuan T Dinh
(74) *Attorney, Agent, or Firm* — Pearne & Gordon LLP

(57) ABSTRACT

An engagement structure for preventing the separation of a resin layer is formed in a contact surface of an insulating substrate in a connecting component, the contact surface being in contact with the resin layer. The resin layer engages with the engagement structure in the contact surface in the insulating substrate in contact with the resin layer, the contact surface forming the side surface of the connecting component.

12 Claims, 14 Drawing Sheets

(51) Int. Cl.
  *H05K 1/03* (2006.01)
  *H05K 1/14* (2006.01)

(56) References Cited

U.S. PATENT DOCUMENTS

2001/0054758 A1* 12/2001 Isaak .................. H01L 25/0657
                                                          257/686
2004/0089943 A1* 5/2004 Kirigaya ........... H01L 23/49811
                                                          257/723
2005/0260867 A1* 11/2005 Ono ....................... H01R 9/096
                                                          439/65
2009/0263938 A1  10/2009 Ino

FOREIGN PATENT DOCUMENTS

JP   2009-260132 A   11/2009
WO   2007/110985 A1  10/2007

OTHER PUBLICATIONS

Notification of Preliminary Rejection issued in Application No. KR2014-0007754 on Apr. 16, 2015.

* cited by examiner

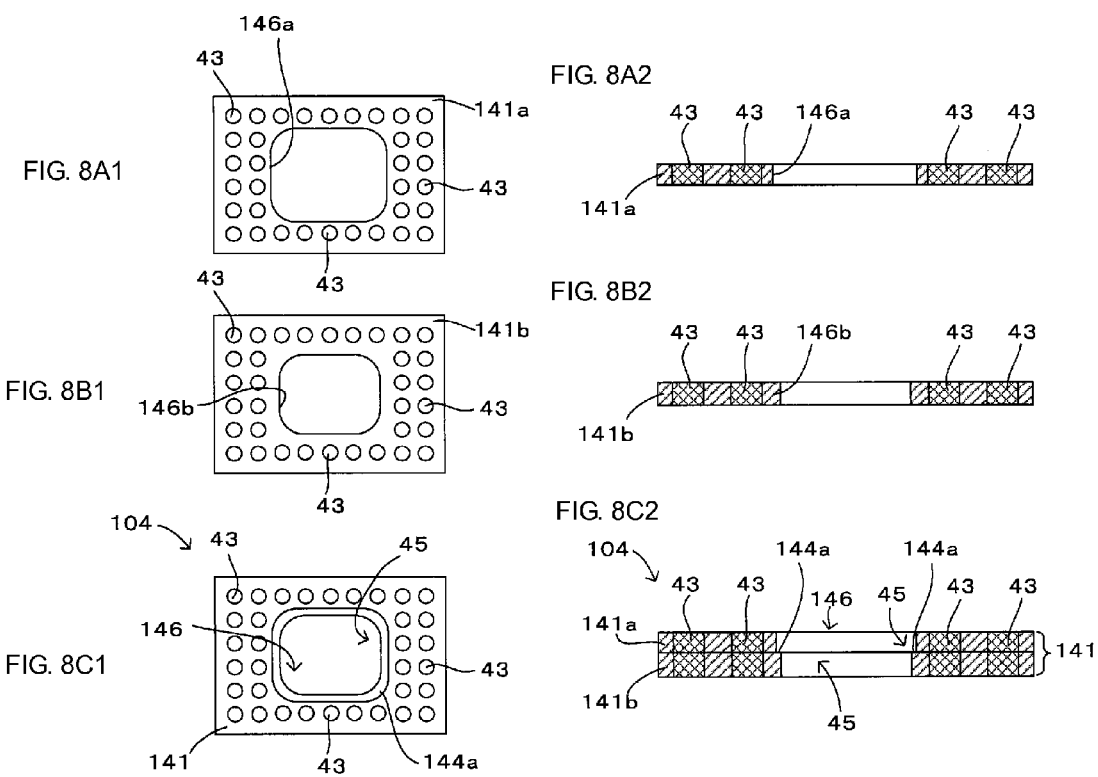

MODULE AND METHOD OF MANUFACTURING THE SAME

BACKGROUND OF THE INVENTION

1. Field of the Invention

The present invention relates to a module including a resin layer on a first principal surface of a circuit board and a method of manufacturing the module.

2. Description of the Related Art

In a known module 500 illustrated in FIG. 14, a mounting component 502, such as an IC chip, is mounted on a first principal surface 501a of a circuit board 501, and the mounting component 502 and mounting electrodes 503 on the first principal surface 501a of the circuit board 501 are connected to each other with bonding wires 504. Mounting components 506, such as chip capacitors or IC chips, are mounted on mounting electrodes 505 on a second principal surface 501b of the circuit board 501 by solder reflowing or flip-chip bonding as needed.

A connecting component 507 for use in external connection for connecting the circuit board 501 to another board 600 or other element is mounted on the mounting electrodes 503 on the first principal surface 501a of the circuit board 501 using binders, such as solder. The connecting component 507 has a frame shape with a through-hole 508 in its substantially central portion. The mounting component 502 is arranged in a cavity formed from the through-hole 508. The circuit board 501 and the board 600 are electrically connected to each other with a connection member 509 on the connecting component 507. To protect the mounting component 502 from mechanical breakage and the environment, such as heat or moisture, a resin layer 510 formed by filling the cavity formed from the through-hole 508 with a resin is disposed so as to cover the first principal surface 501a of the circuit board 501, the mounting component 502, and the inner side surface of the connecting component 507 (see, for example, paragraph Nos. 0051 to 0058 and FIG. 1 in International Publication No. 2007/110985).

The above-described known module 500 has a low degree of adhesion between the inner side surface of the connecting component 507 and the resin layer 510. Thus the inner side surface and the resin layer 510 may be detached from each other, the resin layer 510 or the connecting component 507 may be separated from the first principal surface 501a of the circuit board 501. This may lead to degradation in module characteristics.

BRIEF SUMMARY OF THE INVENTION

Accordingly, it is an object of the present invention to provide a technique capable of stabilizing module characteristics by preventing the separation of a resin layer or a connecting component on a first principal surface of a circuit board.

According to preferred embodiments of the present invention, a module includes a circuit board, a mounting component, a connecting component, and a resin layer. The mounting component is mounted on a first principal surface of the circuit board. The connecting component for use in external connection is mounted on the first principal surface of the circuit board. The resin layer covers the first principal surface of the circuit board, the mounting component, and a side surface of the connecting component. The connecting component includes an insulating substrate and a plurality of interlayer connection conductors arranged in the insulating substrate. Each of the interlayer connection conductors includes a first end connected to the first principal surface of the circuit board and a second end externally connected. An engagement structure for preventing the resin layer from being separated is formed in a contact surface of the insulating substrate with the resin layer.

In the above-described module, the mounting component and the connecting component for use in external connection are mounted on the first principal surface of the circuit board. The resin layer covering the first principal surface of the circuit board, the mounting component, and the side surface of the connecting component is disposed on the first principal surface of the circuit board. The interlayer connection conductors are disposed in the insulating substrate in the connecting component. Each of the interlayer connection conductors includes the first end connected to the first principal surface of the circuit board and the second end externally connected. Thus the circuit board is externally connected through the interlayer connection conductors.

The engagement structure for preventing the separation of the resin layer is disposed in the contact surface of the insulating substrate in the connecting component in contact with the resin layer. Accordingly, the engagement of the resin layer with the engagement structure formed in the contact surface of the insulating substrate forming the side surface of the connecting component in contact with the resin layer can prevent the separation of the resin layer or the connecting component on the first principal surface of the circuit board. The separation of the resin layer from the side surface of the connecting component can also be prevented. The degree of adhesion in the contact surface between the resin layer and the connecting component can be improved. Thus the module characteristics can be stabilized.

The insulating substrate may substantially the same outer frame shape as the circuit board.

With this configuration, the practical module in which the mounting component can be mounted on the first principal surface of the circuit board in a space inside the frame-shaped insulating substrate can be provided. The module is externally connected to another board or other element in the outer region of the circuit board where the connecting component is arranged. Thus the strength of connection between the module and another board when the module is externally connected to the other board can be improved.

The insulating substrate may include a plurality of insulating layers, the plurality of insulating layers may include respective end faces forming the contact surface, and the engagement structure may be formed by arranging the end faces of the insulating layers as being displaced from one another.

With this configuration, the arrangement in which the end faces of the insulating layers in the multilayer insulating substrate in the connecting component enables the engagement structure made of projections and depressions formed by the displaced end faces to be formed in the side surface of the connecting component.

In the contact surface, projections and depressions may be formed as the engagement structure in a thickness direction of the insulating substrate.

With this configuration, the projections and depressions are formed in the contact surface of the insulating substrate in contact with the resin layer in the thickness direction. Thus even if a stress or other force is exerted on the resin layer covering the side surface of the connecting component in a direction in which it separates from the first principal surface of the circuit board, movement of the resin layer in the direction in which it separates from the first principal surface of the circuit board can be reliably prevented by engagement of the resin layer with the inner side surfaces of the depressions or the outer side surfaces of the projections formed in the side surface of the connecting component. Accordingly, the separation of the resin layer from the first principal surface of the circuit board can be reliably prevented. Even if a similar stress is exerted on the connecting component, for the same reason, the separation of the connecting component from the first principal surface of the circuit board can be reliably prevented.

According to preferred embodiments of the present invention, a method of manufacturing a module includes a preparing step of preparing a circuit board, a mounting step of mounting a mounting component and a connecting component for use in external connection on a first principal surface of the circuit board, and a molding step of forming a resin layer that covers the first principal surface of the circuit board, the mounting component, and a side surface of the connecting component. The connecting component includes an insulating substrate and a plurality of interlayer connection conductors arranged in the insulating substrate. Each of the interlayer connection conductors includes a first end connected to the first principal surface of the circuit board and a second end externally connected. An engagement structure for preventing the resin layer from being separated is formed in a contact surface of the insulating substrate with the resin layer.

With this method, the above-described module capable of reliably preventing separation of the resin layer or the connecting component from the first principal surface of the circuit board by the engagement structure formed in the contact surface of the insulating substrate in contact with the resin layer can be manufactured.

The engagement structure may be formed by cutting.

With this process, the engagement structure can be easily formed by cutting the contact surface of the insulating substrate in contact with the resin layer.

The insulating substrate may include a plurality of insulating layers. The engagement structure may be formed by arranging the end faces of the insulating layers as being displaced from one another.

With this process, the engagement structure made of the projections and depressions can be easily formed in the contact surface of the insulating substrate in contact with the resin layer by the arrangement in which the end faces of the insulating layers in the multilayer insulating substrate are displaced from one another.

Other features, elements, characteristics and advantages of the present invention will become more apparent from the following detailed description of preferred embodiments of the present invention with reference to the attached drawings.

BRIEF DESCRIPTION OF THE SEVERAL VIEWS OF THE DRAWINGS

FIGS. 8A1 to 8C2 illustrate a connecting component in a module according to a second embodiment of the present invention, FIGS. 8A1 and 8B1 are plan views of insulating layers in an insulating substrate, FIG. 8C1 is a plan view of the insulating substrate, and FIGS. 8A2 to 8C2 are cross-sectional views corresponding to FIGS. 8A1 to 8C1, respectively;

FIGS. 9A and 9B are plan views of the insulating layers in the insulating substrate, and FIG. 9C is a plan view of the insulating substrate;

FIGS. 10A and 10B are plan views of the insulating layers in the insulating substrate, and FIG. 10C is a plan view of the insulating substrate;

FIGS. 11A and 11B are plan views of the insulating layers in the insulating substrate, and FIG. 11C is a plan view of the insulating substrate;

FIG. 12A is a cross-sectional view of the insulating layers in the insulating substrate, and FIG. 12B is a cross-sectional view of the insulating substrate;

DETAILED DESCRIPTION OF THE INVENTION

First Embodiment

Figure 1:
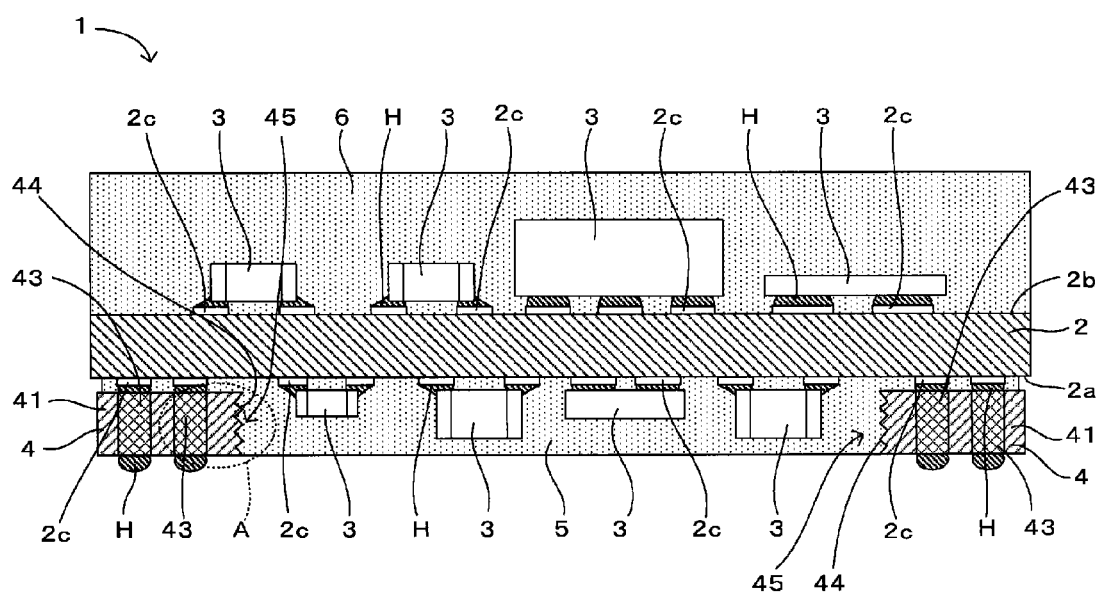
FIG. 1 is a cross-sectional view of a module according to a first embodiment of the present invention.
Figure 2:
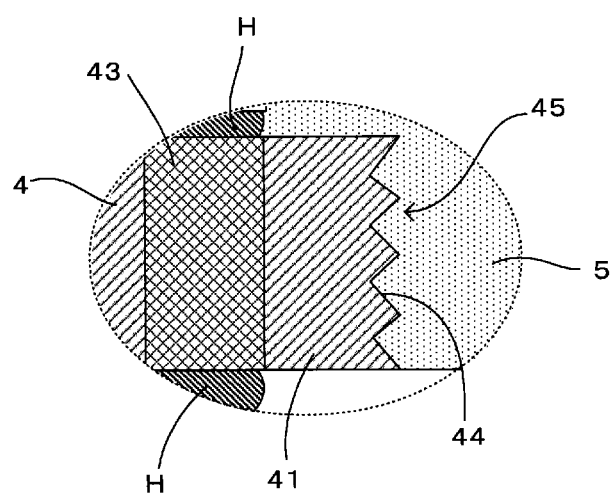
FIG. 2 is an enlarged view of a main portion of the module illustrated in FIG. 1.
Figure 3:
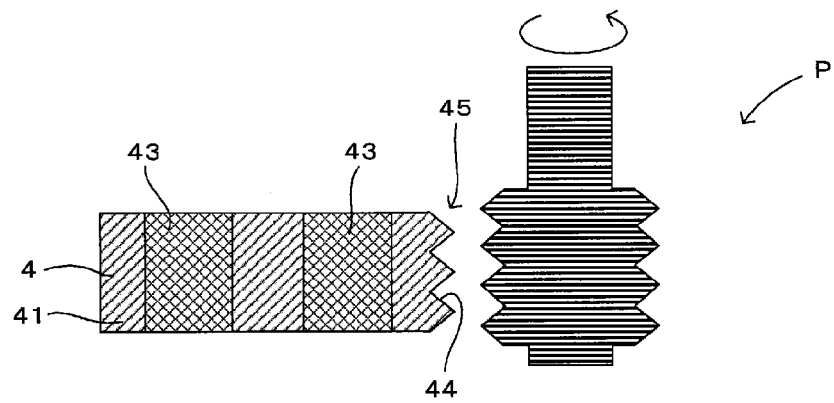
FIG. 3 illustrates an example method of manufacturing an engagement structure.

A first embodiment of the present invention is described with reference to FIGS. 1 to 3. FIG. 1 is a cross-sectional view of a module according to the first embodiment of the present invention. FIG. 2 is an enlarged view of a main portion of the module illustrated in FIG. 1. FIG. 3 illustrates an example method of manufacturing an engagement structure.

A module 1 is formed as a high-frequency communication module, such as a Bluetooth (registered trademark) module, a wireless local area network (LAN) module, or an antenna switch module, or a power supply circuit module by mounting the mounting components 3, such as ICs and stacked ceramic chip components 3, on both principal surfaces 2a and 2b of a circuit board 2 in the module 1. As illustrated in FIG. 1, the module 1 includes the circuit board 2, the mounting components 3 on both the principal surfaces 2a and 2b, and a connecting component 4 for use in external connection mounted on the first principal surface 2a.

A resin layer 5 covering the first principal surface 2a of the circuit board 2, the mounting components 3, and the inner side surface of the connecting component 4 is disposed on the first principal surface 2a of the circuit board 2. A resin layer 6 covering the second principal surface 2b and the mounting components 3 is disposed on the second principal surface 2b of the circuit board 2. Each of the resin layers 5 and 6 is made of general thermosetting resin for molding, such as epoxy resin or cyanate resin.

The circuit board 2 is made of a general substrate, such as a resin substrate made of glass epoxy resin or liquid crystal polymer, a low temperature co-fired ceramic (LTCC) substrate, or a glass substrate. Depending on the intended use of the module 1, the circuit board 2 may be a single-layer board or a multilayer board. A plurality of mounting electrodes 2c for mounting the mounting components 3 and the connecting component 4 by bonding them using a binder, such as solder H, or ultrasonic vibration bonding are disposed on both the principal surfaces 2a and 2b of the circuit board 2. Wiring electrodes, such as in-plane electrodes (not illustrated) and via conductors (not illustrated), made of conductive materials including silver, copper, gold, or other element are disposed inside the circuit board 2 as needed. The mounting electrodes 2c are electrically connected thorough the wiring electrodes inside the circuit board 2. Various electric circuits formed by combinations of the in-plane electrodes and via conductors may be disposed inside the circuit board 2.

An example process of forming the circuit board 2 made of an LTCC multilayer substrate is described below. That is, first, ceramic green sheets are prepared. The ceramic green sheets are made of slurry sheets in which the mixed powder of aluminium oxide, glass, and other material is mixed with an organic binder, solvent, and other material. Then, via conductors for use in interlayer connection are formed by filling via holes formed by laser processing in predetermined positions of the ceramic green sheets with conductive paste including silver, copper, or other element and various wiring patterns are formed by printing using conductive paste. The ceramic green sheets are stacked and attached by pressure to form a ceramic laminate. The ceramic laminate is heated at low temperature in the neighboring of approximately 1000° C., so-called, is low-temperature fired. In this way, the circuit board 2 is formed.

The connecting component 4 includes an insulating substrate 41 having substantially the same outer frame shape as the circuit board 2. The insulating substrate 41 is made of a general substrate, such as a resin substrate made of glass epoxy resin or liquid crystal polymer, a low temperature co-fired ceramic (LTCC) substrate, or a glass substrate, as in the case of the circuit board 2. The insulating substrate 41 may be a single-layer substrate or a multilayer substrate.

A plurality of interlayer connection conductors 43 are arranged in the insulating substrate 41 by providing conductive paste including silver, copper, gold, or other element or disposing metal bars, such as copper. Each of the interlayer connection conductors 43 includes a first end connected to the mounting electrode 2c on the first principal surface 2a of the circuit board 2 with the solder H or other element and a second end externally connected to another board or other element with the solder H or other element. This enables the module 1 (circuit board 2) to be externally connected to the other board or element.

As illustrated in FIG. 2, which is an enlarged view of a region A surrounded by the dotted lines in FIG. 1, an engagement structure 45 for preventing the separation of the resin layer 5 is made of projections and depressions 44 extending in the thickness direction of the insulating substrate 41 over the whole of the frame-shaped inner side surfaces being a contact surface in contact with the resin layer 5.

Next, an example method of manufacturing the module 1 is described.

First, the circuit board 2 is prepared (preparing step). After the mounting components 3 are mounted on the second principal surface 2b of the circuit board 2, the resin layer 6 is formed by filling the second principal surface 2b with general thermosetting resin for molding, such as epoxy resin. Then, the mounting components 3 and the connecting component 4 are mounted on the first principal surface 2a of the circuit board 2 (mounting step). The resin layer 5 covering the first principal surface 2a of the circuit board 2, the mounting components 3, and the inner side surface of the connecting component 4 (insulating substrate 41) is formed by filling the first principal surface 2a of the circuit board 2 with resin, as in the case of the second principal surface 2b, and the module 1 is completed (molding step). The process of mounting the mounting components 3, the connecting component 4, and the resin layer 5 on the first principal surface 2a of the circuit board 2 and the process of mounting the mounting components 3 and the resin layer 6 on the second principal surface 2b may be performed in any order.

As illustrated in FIG. 3, the projections and depressions 44 are formed as the engagement structure 45 in the inner side surface of the insulating substrate 41 in contact with the resin layer 5 by cutting with a cutting tool P. FIG. 3 illustrates only a part of the insulating substrate 41 for the sake of simplification of description. Similarly, FIGS. 4 to 7, which are used in the description below, also illustrate only a part of the insulating substrate 41, and this note is not repeated in the description below.

(Variations of Engagement Structure)

Variations of the engagement structure 45 formed by cutting with the cutting tool P are described with reference to FIGS. 4 to 7. FIGS. 4 to 7 illustrate the variations of the engagement structure.

Figure 4:
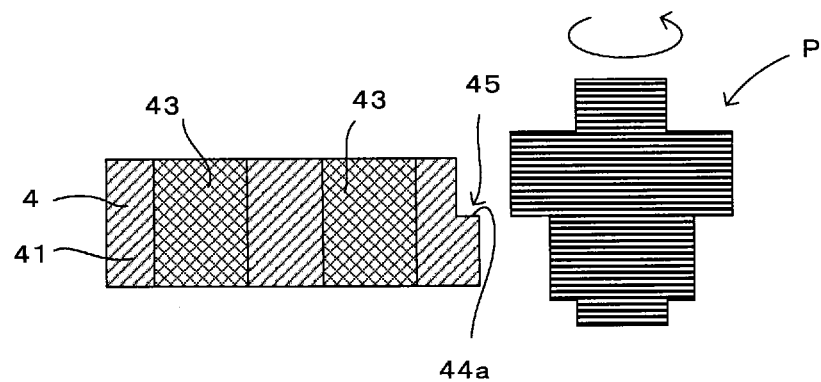
FIG. 4 illustrates a variation of the engagement structure.

In the example illustrated in FIG. 4, a step 44a is formed as the engagement structure 45 over the whole of the inner side surface of the insulating substrate 41 by cutting the inner side surface with the cutting tool P. The step 44a is formed such that the lower portion of the inner side surface of the insulating substrate 41 protrudes toward the inside of the opening at a substantially central position of the insulating substrate 41 farther than the upper portion. With this configuration, for example, if the resin layer 5 attempts to move in a direction in which the resin layer 5 separates from the first principal surface 2a of the circuit board 2, the engagement of the resin layer 5 with the step 44a prevents such a movement.

Figure 5:
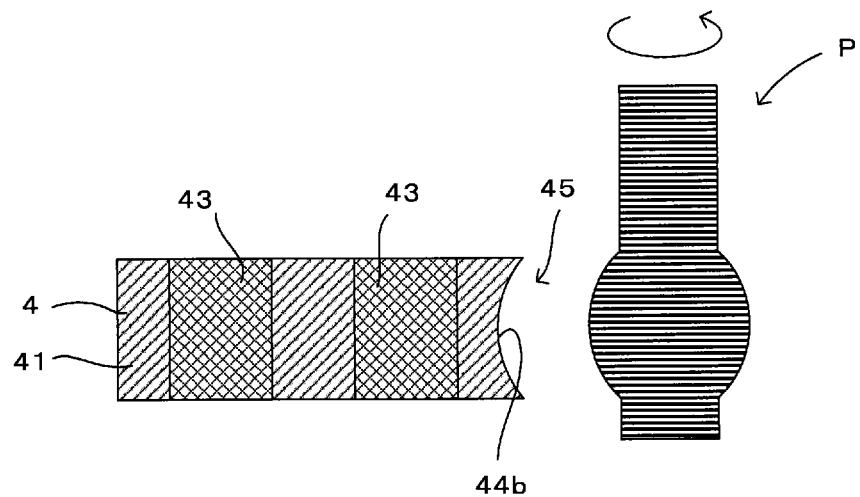
FIG. 5 illustrates another variation of the engagement structure.

In the example illustrated in FIG. 5, a concave portion 44b is formed as the engagement structure 45 over the whole of the inner side surface of the insulating substrate 41 by cutting the inner side surface with the cutting tool P. The concave portion 44b has a substantially concave cross section. With this configuration, for example, if the resin layer 5 attempts to move in a direction in which the resin layer 5 separates from the first principal surface 2a of the circuit board 2, the engagement of the resin layer 5 with the concave portion 44b prevents such a movement.

Figure 6:
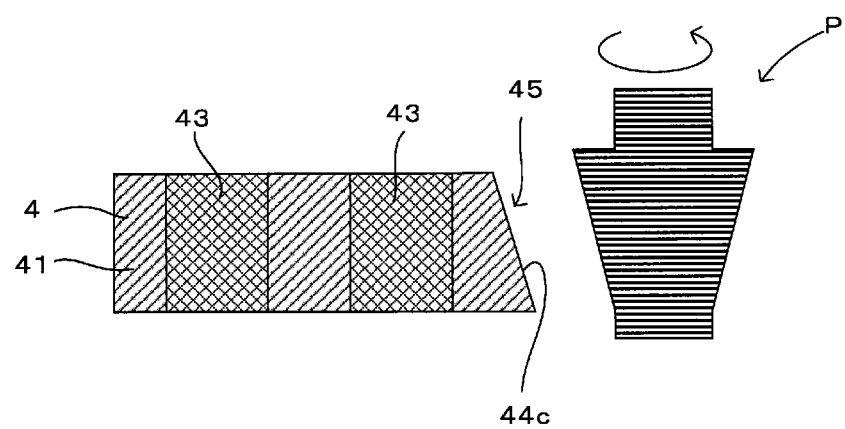
FIG. 6 illustrates yet another variation of the engagement structure.

In the example illustrated in FIG. 6, an inclined slope 44c is formed as the engagement structure 45 over the whole of the inner side surface of the insulating substrate 41 by cutting the inner side surface with the cutting tool P. The inclined slope 44c has a substantially cup-shaped cross section that tapers toward the bottom. With this configuration, for example, if the resin layer 5 attempts to move in a direction in which the resin layer 5 separates from the first principal surface 2a of the circuit board 2, the engagement of the resin layer 5 with the inclined slope 44c prevents such a movement.

Figure 7:
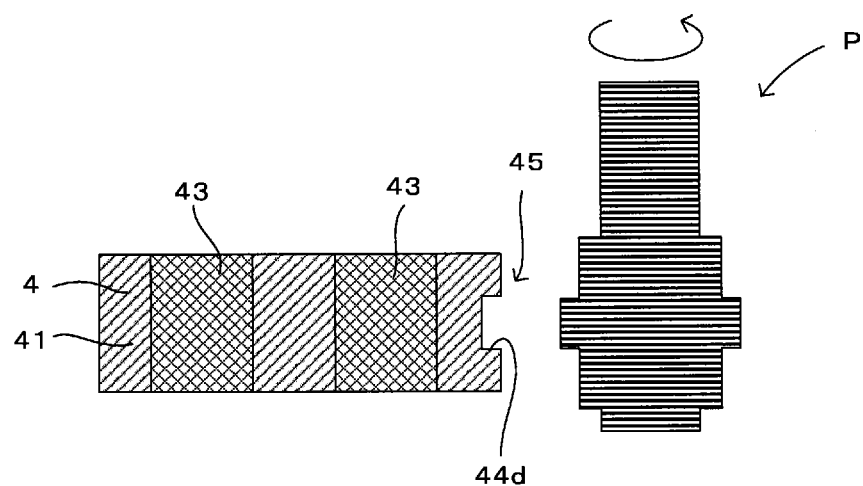
FIG. 7 illustrates still another variation of the engagement structure.

In the example illustrated in FIG. 7, a groove 44d is formed as the engagement structure 45 over the whole of the inner side surface of the insulating substrate 41 by cutting the inner side surface with the cutting tool P. With this configuration, for example, if the resin layer 5 attempts to move in a direction in which the resin layer 5 separates from the first principal surface 2a of the circuit board 2, the engagement of the resin layer 5 with the groove 44d prevents such a movement.

As described above, according to the present embodiment, the mounting components 3 and the connecting component 4 for use in external connection are mounted on the first principal surface 2a of the circuit board 2. The resin layer 5 covering the first principal surface 2a of the circuit board 2, the mounting components 3, and the side surface of the connecting component 4 is disposed on the first principal surface 2a of the circuit board 2. The interlayer connection conductors 43 are disposed in the insulating substrate 41 in the connecting component 4. The first end of each of the interlayer connection conductors 43 is connected to the mounting electrode 2c on the first principal surface 2a of the circuit board 2, and the second end thereof is externally connected. Thus the module 1 (circuit board 2) is externally connected through the interlayer connection conductors 43.

The engagement structure 45 for preventing the separation of the resin layer 5 is disposed in the contact surface of the insulating substrate 41 in the connecting component 4 in contact with the resin layer 5. Accordingly, the engagement of the resin layer 5 with the engagement structure 45 formed in the contact surface of the insulating substrate 41 forming the side surface of the connecting component 4 in contact with the resin layer 5 can prevent the separation of the resin layer 5 or the connecting component 4 on the first principal surface 2a of the circuit board 2. Separation of the resin layer 5 from the side surface of the connecting component 4 can also be prevented. The degree of adhesion in the contact surface between the resin layer 5 and the connecting component 4 can be improved. Thus the module characteristics can be stabilized.

The module 1 having a practical configuration in which the mounting components 3 can be mounted on the first principal surface 2a of the circuit board 2 in a space surrounded by the inner side surface of the frame-shaped insulating substrate 41 can be provided. The module 1 is externally connected to another board or other element in the outer region of the circuit board 2 where the connecting component 4 is arranged. Thus the strength of connection between the module 1 and another board when the module 1 is externally connected to the other board can be improved.

The projections and depressions 44 are formed in the contact surface of the insulating substrate 41 in contact with the resin layer 5 in the thickness direction. Thus even if a stress or other force is exerted on the resin layer 5 covering the side surface of the connecting component 4 in a direction in which it separates from the first principal surface 2a of the circuit board 2, the movement of the resin layer 5 in the direction in which it separates from the first principal surface 2a of the circuit board 2 can be reliably prevented by the engagement of the resin layer 5 with the inner side surfaces of the depressions or the outer side surfaces of the projections formed in the side surface of the connecting component 4. Accordingly, the separation of the resin layer 5 from the first principal surface 2a of the circuit board 2 can be reliably prevented. Even if a similar stress is exerted on the connecting component 4, for the same reason, the separation of the connecting component 4 from the first principal surface of the circuit board can be reliably prevented.

The connecting component 4 including the engagement structure 45 in the insulating substrate 41 can be formed in the contact surface in contact with the resin layer 5 on the first principal surface 2a of the circuit board 2. Thus the module 1 capable of reliably preventing separation of the resin layer 5 or the connecting component 4 from the first principal surface 2a of the circuit board 2 can be easily manufactured.

The engagement structure 45 can be easily formed in the contact surface of the insulating substrate 41 in contact with the resin layer 5 by cutting using the cutting tool P.

Second Embodiment

A second embodiment of the present invention is described with reference to FIGS. 8A1 to 8C2. FIGS. 8A1 to 8C2 illustrate a connecting component in a module according to the second embodiment of the present invention. FIGS. 8A1 and 8B1 are plan views of insulating layers in an insulating substrate. FIG. 8C1 is a plan view of the insulating substrate. FIGS. 8A2 to 8C2 are cross-sectional views corresponding to FIGS. 8A1 to 8C1, respectively.

A connecting component 104 in the second embodiment differs from the connecting component 4 in the first embodiment in that the engagement structure 45 is formed by the arrangement in which the inner side surfaces of a plurality of insulating layers 141a and 141b in an insulating substrate 141, the inner side surfaces being in contact with the resin layer 5, are displaced from each other, as illustrated in FIGS. 8A1 to 8C2. The other configuration is substantially the same as that in the first embodiment, and the description of that configuration is omitted by using the same reference numerals.

In the present embodiment, the insulating substrate 141 is made of a multilayer ceramic substrate. The insulating substrate 141 is formed by stacking the insulating layers 141a and 141b with the plurality of interlayer connection conductors 43 formed in predetermined positions and firing the stacked layers. The insulating substrate 141 may be made of a multilayer resin substrate.

The insulating layers 141a and 141b have openings 146a and 146b, respectively, in their respective substantially central positions. The insulating layer 141a is stacked on the insulating layer 141b, and the insulating substrate 141 having a frame shape with an opening 146 in a substantially central position is formed. The opening 146a in the insulating layer 141a, which is stacked on the insulating layer 141b, is slightly larger than the opening 146b. Accordingly, when the insulating layer 141a is stacked on the insulating layer 141b, a step 144a is formed as the engagement structure 45 over the whole of the inner side surface of the insulating substrate 141 (connecting component 104) in contact with the resin layer 5.

(Variations of Connecting Component)

Variation of the engagement structure 45 formed by arrangement in which the inner side surfaces of the insulating layers 141a and 141b are displaced from each other are described with reference to FIGS. 9A to 11C. FIGS. 9A to 11C illustrate variations of the connecting component. FIGS. 9A, 9B, 10A, 10B, 11A, and 11B are plan views of the insulating layers in the insulating substrate. FIGS. 9C, 10C, and 11C are plan views of the insulating substrate.

Figure 9A:
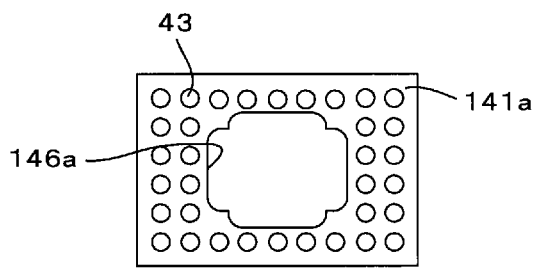
FIGS. 9A to 9C illustrate a variation of the connecting component.
Figure 9B:
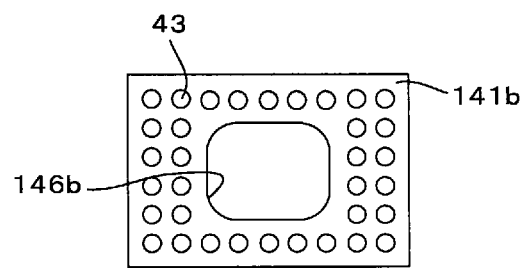
Figure 9C:
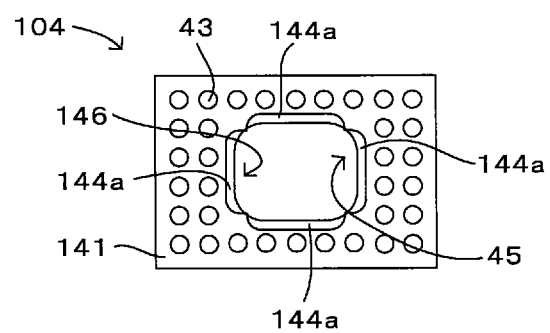

In the example illustrated in FIGS. 9A to 9C, the opening 146a in the insulating layer 141a, which is stacked on the insulating layer 141b, has a substantially cross shape in which substantially rectangles overlap each other. Accordingly, when the insulating layer 141a is stacked on the insulating layer 141b, the steps 144a are formed as the engagement structure 45 in the positions corresponding to the sides of the substantially rectangular opening 146b in the insulating layer 141b in the inner side surface of the insulating substrate 141 (connecting component 104) in contact with the resin layer 5. With this configuration, the engagement structure 45 has a shape more complicated than that in the second embodiment. Thus the degree of adhesion with the resin layer 5 can be further enhanced.

Figure 10A:
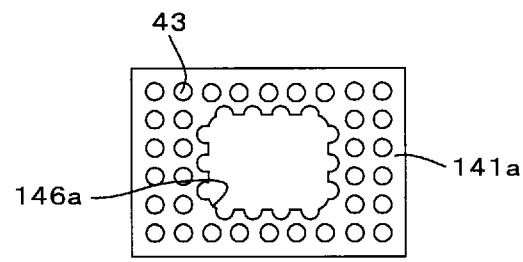
FIGS. 10A to 10C illustrate another variation of the connecting component.
Figure 10B:
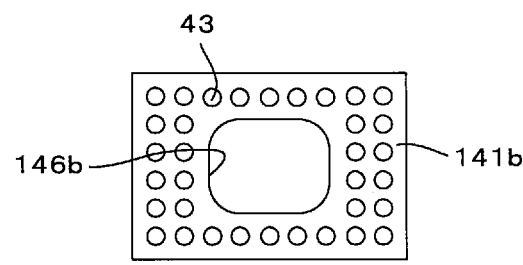
Figure 10C:
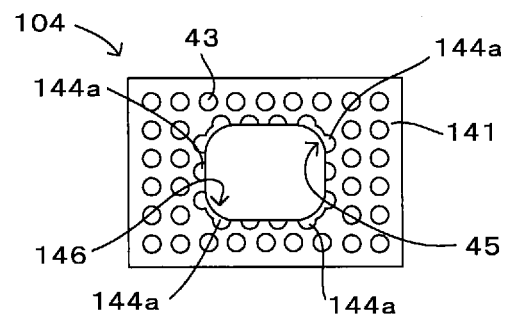

In the example illustrated in FIGS. 10A to 10C, the insulating layer 141a, which is stacked on the insulating layer 141b, has the opening 146a in which substantially semicircular holes are regularly arranged in the edge of the opening having substantially the same shape as the opening 146b in the insulating layer 141b. Accordingly, when the insulating layer 141a is stacked on the insulating layer 141b, the steps 144a are formed as the engagement structure 45 in the positions where the substantially semicircular holes in the opening 146a are formed in the inner side surface of the insulating substrate 141 (connecting component 104) in contact with the resin layer 5. With this configuration, the engagement structure 45 has a shape more complicated than that in the second embodiment. Thus the degree of adhesion with the resin layer 5 can be further enhanced.

Figure 11A:
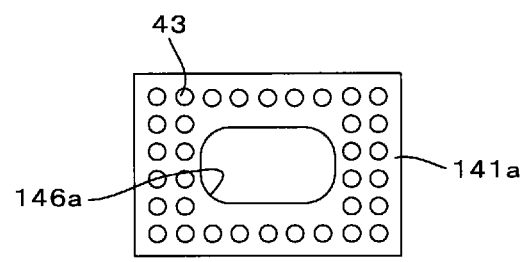
FIGS. 11A to 11C illustrate yet another variation of the connecting component.
Figure 11B:
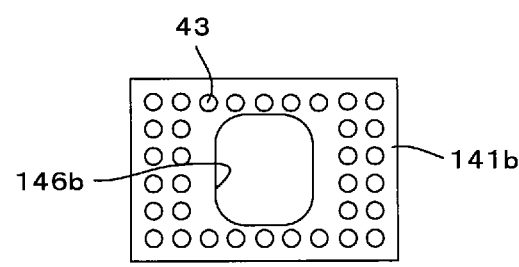
Figure 11C:
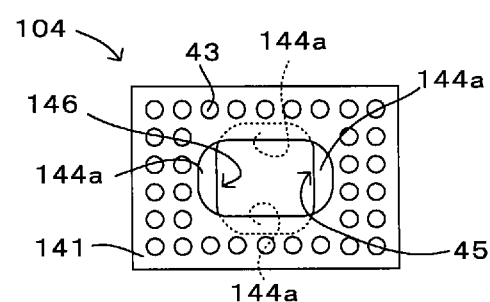

In the example illustrated in FIGS. 11A to 11C, the insulating layers 141a and 141b have the substantially rectangular openings 146a and 146b, respectively. The orientation of the opening 146a and that of the opening 146b are different. Accordingly, when the insulating layer 141a is stacked on the insulating layer 141b, the steps 144a are formed as the engagement structure 45 in positions on both sides of the opening 146a in the longitudinal direction in the surface of the insulating layer 141a and in positions on both sides on both sides of the opening 146b in the longitudinal direction in the surface of the insulating layer 141b in the inner side surface of the insulating substrate 141 (connecting component 104) in contact with the resin layer 5. With this configuration, the engagement structure 45 has a shape more complicated than that in the second embodiment. Thus the degree of adhesion with the resin layer 5 can be further enhanced.

As described above, according to the present embodiment, substantially the same advantageous effects as in the first embodiment are obtainable. In addition, the advantageous effects described below are also obtainable. That is, the arrangement in which the inner side surfaces of the insulating layers 141a and 141b in the multilayer insulating substrate 141 in the connecting component 104 are displaced from each other enables the engagement structure 45 made of the steps 144a in the displaced inner side surfaces to be formed in the inner side surface of the connecting component 104. Accordingly, the arrangement in which the inner side surfaces of the insulating layers 141a and 141b in the multilayer insulating substrate 141 are displaced from each other enables the engagement structure 45 made of the steps 144a to be easily formed in the contact surface of the insulating substrate 141 in contact with the resin layer 5.

Third Embodiment

Figure 12A:
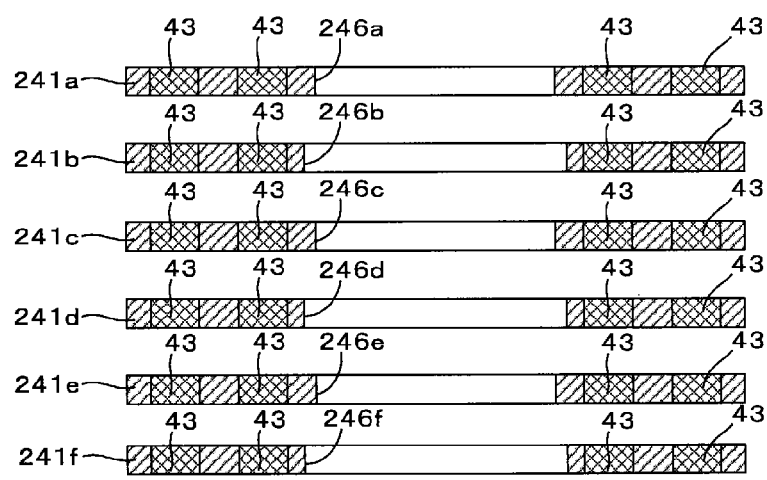
FIGS. 12A and 12B illustrate a connecting component in a module according to a third embodiment of the present invention.
Figure 12B:
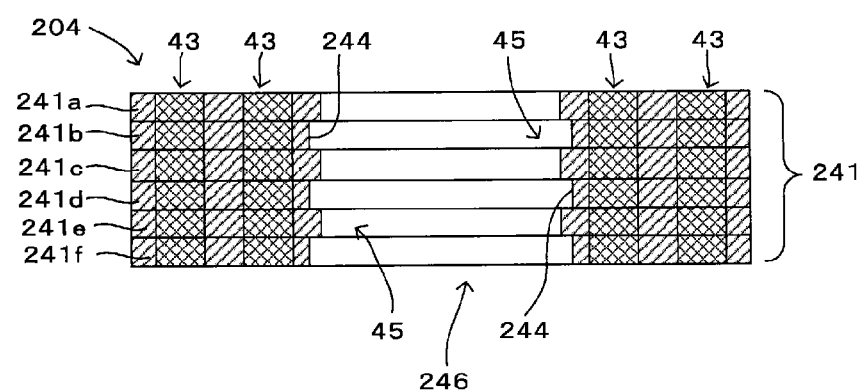

A third embodiment of the present invention is described with reference to FIGS. 12A and 12B. FIGS. 12A and 12B illustrate a connecting component in a module according to a third embodiment of the present invention. FIG. 12A is a cross-sectional view of the insulating layers in the insulating substrate. FIG. 12B is a cross-sectional view of the insulating substrate.

A connecting component 204 in the third embodiment differs from the connecting component 104 in the second embodiment in that an insulating substrate 241 is formed by stacking six insulating layers 241a to 241f, as illustrated in FIGS. 12A and 12B. The engagement structure 45 is formed by arrangement in which the inner side surfaces of the insulating layers 241a to 241f in the insulating substrate 241, the inner side surfaces being in contact with the resin layer 5, are displaced from one another. The other configuration is substantially the same as that in the above-described embodiments, and the description of that configuration is omitted by using the same reference numerals.

In the present embodiment, the insulating substrate 241 is made of a multilayer ceramic substrate. The insulating substrate 241 is formed by stacking the insulating layers 241a to 241f with the plurality of interlayer connection conductors 43 formed in predetermined positions and firing the stacked layers. The insulating substrate 241 may be made of a multilayer resin substrate.

The insulating layers 241a to 241f have openings 246a to 246f, respectively, in their respective substantially central positions. The insulating substrate 241 having a frame shape and an opening 246 in a substantially central position is formed by stacking the insulating layers 241a to 241f in sequence. The openings 246b, 246d, and 246f in the insulating layers 241b, 241d, and 241f are slightly larger than the openings 246a, 246c, and 246e in the insulating layers 241a, 241c, and 241e. Accordingly, when the insulating layers 241a to 241f are stacked in sequence, the large openings 246b, 246d, and 246f and the small openings 246a, 246c, and 246e are alternately arranged, and thus projections and depressions 244 are formed in the stacking direction as the engagement structure 45 over the whole of the inner side surface of the insulating substrate 241 (connecting component 204) in contact with the resin layer 5.

As described above, according to the present embodiment, even with the insulating substrate 241 formed by stacking three or more insulating layers, substantially the same advantageous effects as in the above-described embodiments are also obtainable.

<Others>

In the above-described embodiments, the connecting components 4, 104, and 204 are made of the frame-shaped insulating substrates 41, 141, and 241, respectively. The shape of the insulating substrate included in the connecting component is not limited to the frame shape. Example variations of the connecting component with other than the frame shape are illustrated in FIGS. 13A and 13B.

Figure 13A:
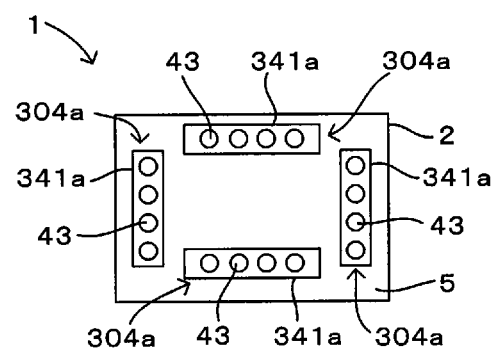
FIGS. 13A to 13C illustrate different variations of the connecting component.
Figure 13B:
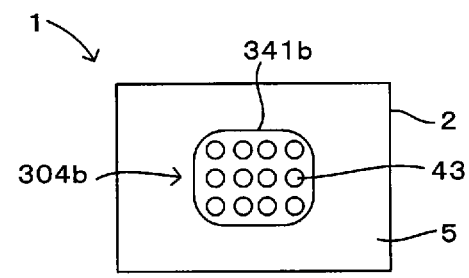

In the example illustrated in FIG. 13A, a plurality of connecting components 304a made of strip-shaped insulating substrates 341a are arranged on the first principal surface 2a of the circuit board 2 in a substantially rectangular manner. In the example illustrated in FIG. 13B, a connecting component 304b made of a substantially rectangular insulating substrate 341b is arranged and mounted in a substantially central position on the first principal surface 2a of the circuit board 2.

When each of the insulating substrates 341a and 341b is made of a multilayer substrate, as in the case of the second and third embodiments, for example, the engagement structure 45 can be formed in a way described below. That is, the engagement structure 45 can be formed in the contact surface in contact with the resin layer 5 in each of the connecting components 304a and 304b by arrangement in which the end faces in the insulating layers included in the insulating substrates 341a and 341b in contact with the resin layer 5 are displaced from one another.

Figure 13C:
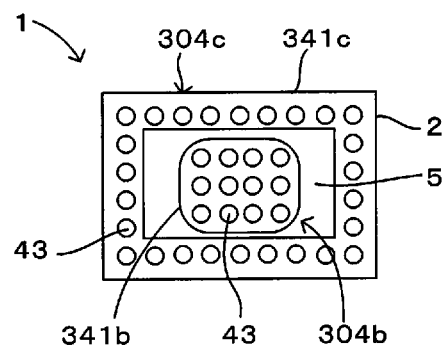
Figure 14:
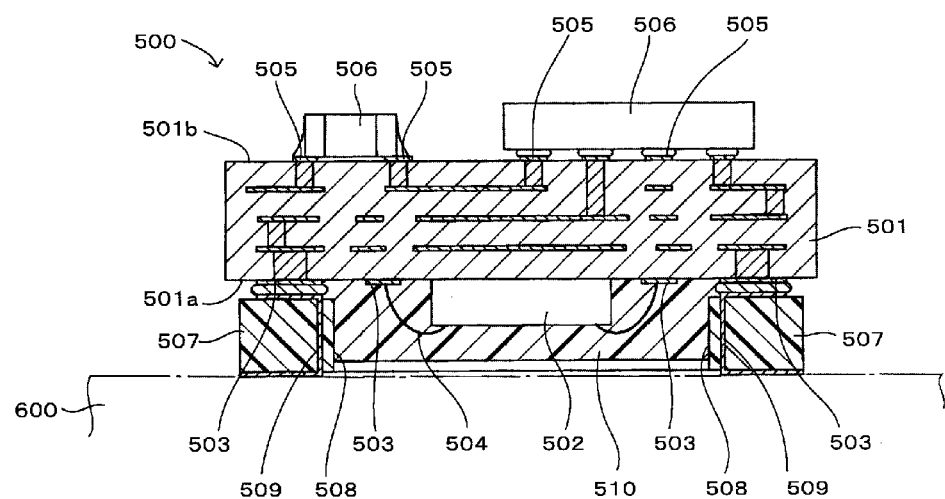
FIG. 14 is a cross-sectional view of a known module.

A plurality of connecting components of different types may be mounted on the first principal surface 2a of the circuit board 2. For example, as illustrated in the variation of the connecting component in FIG. 13C, the substantially rectangular connecting component 304b may be arranged inside a connecting component 304c made of a frame-shaped insulating substrate 341c.

The present invention is not limited to the above-described embodiments. In addition to the above-described ones, various changes may be made without departing from the spirit or scope of the present invention. For example, the opening in the frame-shaped insulating substrate may be changed to any shape, such as substantially rectangles or circles, depending on the configuration of the circuit board.

Any mounting components may be mounted on the circuit board so as to enable the module to have functions corresponding to the use achieved by an increase in the mounting density of the module. The mounting components may not be mounted on the second principal surface of the circuit board.

A method for mounting the mounting components on both principal surfaces of a circuit board in a module is not limited to a method using solder. For example, the mounting components may be mounted on the circuit board by a mounting method using an ultrasonic vibration technique, that using a surface activating technique by plasma, or a mounting method using bonding wires.

The present invention is widely applicable to modules each including a resin layer on a first principal surface of a circuit board.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A module comprising:
    a circuit board;
    a mounting component mounted on a first principal surface of the circuit board;
    a connecting component for use in external connection mounted on the first principal surface of the circuit board; and
    a resin layer that covers the first principal surface of the circuit board, the mounting component, and a side surface of the connecting component,
    the connecting component including:
        an insulating substrate; and
        a plurality of interlayer connection conductors arranged in the insulating substrate,
    wherein each of the interlayer connection conductors includes a first end connected to the first principal surface of the circuit board and a second end externally connected, and
    the insulating substrate has a frame shape with frame-shaped inner side surfaces, covers the plurality of interlayer connection conductors, and includes an engagement structure for preventing the resin layer from being separated, and wherein the engagement structure is formed in each of the frame-shaped inner side surfaces of the insulating substrate being in contact with the resin layer.

2. The module according to claim 1, wherein the insulating substrate has substantially the same outer frame shape as the circuit board.

3. The module according to claim 1, wherein the insulating substrate includes a plurality of insulating layers,
    the plurality of insulating layers include respective end faces forming the contact surface, and
    the engagement structure is formed by arranging the end faces of the insulating layers as being displaced from one another.

4. The module according to claim 1, wherein projections and depressions are formed as the engagement structure in the contact surface in a thickness direction of the insulating substrate.

5. A method of manufacturing a module, the method comprising:
    a preparing step of preparing a circuit board;
    a mounting step of mounting a mounting component and a connecting component for use in external connection on a first principal surface of the circuit board; and
    a molding step of forming a resin layer that covers the first principal surface of the circuit board, the mounting component, and a side surface of the connecting component,
    the connecting component including:
        an insulating substrate; and
        a plurality of interlayer connection conductors arranged in the insulating substrate,
    wherein each of the interlayer connection conductors includes a first end connected to the first principal surface of the circuit board and a second end externally connected, and
    the insulating substrate has a frame shape with frame-shaped inner side surfaces, covers the plurality of interlayer connection conductors, and includes an engagement structure for preventing the resin layer from being separated, and wherein the engagement structure is formed in each of the frame-shaped inner side surfaces of the insulating substrate being in contact with the resin layer.

6. The method of manufacturing a module according to claim 5, wherein the engagement structure is formed by cutting.

7. The method of manufacturing a module according to claim 5, wherein the insulating substrate includes a plurality of insulating layers, and
    the engagement structure is formed by arranging end faces of the insulating layers as being displaced from one another.

8. The module according to claim 2, wherein the insulating substrate includes a plurality of insulating layers,
    the plurality of insulating layers include respective end faces forming the contact surface, and
    the engagement structure is formed by arranging the end faces of the insulating layers as being displaced from one another.

9. The module according to claim 2, wherein projections and depressions are formed as the engagement structure in the contact surface in a thickness direction of the insulating substrate.

10. The module according to claim 3, wherein projections and depressions are formed as the engagement structure in the contact surface in a thickness direction of the insulating substrate.

11. The module according to claim 1, wherein the first principal surface is a bottom surface of the circuit board and the engagement structure is located at a side of the bottom surface of the circuit board.

12. The method of manufacturing a module according to claim 5, wherein the first principal surface is a bottom surface of the circuit board and the engagement structure is located at a side of the bottom surface of the circuit board.

* * * * *